US011444415B2

(12) United States Patent
Davis

(10) Patent No.: US 11,444,415 B2
(45) Date of Patent: Sep. 13, 2022

(54) UNINTERRUPTIBLE POWER SUPPLIES WITH REPLACEABLE RECEPTACLE PANELS AND RELATED METHODS

(71) Applicant: Eaton Intelligent Power Limited, Dublin (IE)

(72) Inventor: Scott Jason Davis, Youngsville, NC (US)

(73) Assignee: Eaton Intelligent Power Limited, Dublin (IE)

(*) Notice: Subject to any disclaimer, the term of this patent is extended or adjusted under 35 U.S.C. 154(b) by 486 days.

(21) Appl. No.: 16/588,048

(22) Filed: Sep. 30, 2019

(65) Prior Publication Data
US 2021/0098946 A1 Apr. 1, 2021

(51) Int. Cl.
*H05K 5/02* (2006.01)
*H01R 13/707* (2006.01)
(Continued)

(52) U.S. Cl.
CPC ......... *H01R 13/707* (2013.01); *H01R 13/713* (2013.01); *H01R 31/02* (2013.01);
(Continued)

(58) Field of Classification Search
CPC .... H01R 13/707; H01R 13/713; H01R 31/02; H01R 31/065; H01R 33/97; H02J 9/06;
(Continued)

(56) References Cited

U.S. PATENT DOCUMENTS 5,361,196 A 11/1994 Tanamachi et al.
5,821,636 A 10/1998 Baker et al.
(Continued)

FOREIGN PATENT DOCUMENTS

CN 202564669 11/2012
CN 207638180 7/2018
(Continued)

OTHER PUBLICATIONS

C&C Power: Engineered Power Products "Ac Outlet Panel" product description, http://www.ccpower.com/products/ac-outlet-panel/ (2 pages) (printed from the internet May 21, 2019).
(Continued)

*Primary Examiner* — Jacob R Crum
(74) *Attorney, Agent, or Firm* — Myers Bigel, P.A.

(57) ABSTRACT

A power supply system includes a housing comprising internal power circuitry; a receptacle panel removably coupled to the housing; and a circuit interrupter, such as a circuit breaker or fused disconnect switch, held in the housing. The circuit breaker includes a switch handle that is externally accessible and configured to allow a user to translate the switch handle between OFF and ON positions, the OFF position associated with electrical isolation of the power receptacle panel from a power output path between the receptacle panel and the internal power circuitry. In the OFF position, even when the power supply system is in an ON state, the receptacle panel is in electric isolation from the internal power circuitry and de-energized to thereby allow a user to remove the receptacle panel to thereby allow a hot swap with another receptacle panel.

27 Claims, 7 Drawing Sheets

(51) Int. Cl.

| | | |
|---|---|---|
| *H01R 13/713* | (2006.01) | |
| *H01R 31/02* | (2006.01) | |
| *H01R 31/06* | (2006.01) | |
| *H01R 33/97* | (2006.01) | |
| *H02J 9/06* | (2006.01) | |
| *H05K 7/14* | (2006.01) | |
| *H05K 7/18* | (2006.01) | |

(52) U.S. Cl.
CPC ........... *H01R 31/065* (2013.01); *H01R 33/97* (2013.01); *H02J 9/061* (2013.01); *H05K 5/0204* (2013.01); *H05K 5/0208* (2013.01); *H05K 5/0256* (2013.01); *H05K 7/14* (2013.01); *H05K 7/18* (2013.01)

(58) Field of Classification Search
CPC ..... H02J 9/061; H05K 5/0204; H05K 5/0208; H05K 5/0256; H05K 7/14; H05K 7/18
See application file for complete search history.

(56) References Cited

U.S. PATENT DOCUMENTS

| | | | |
|---|---|---|---|
| 6,218,744 B1 | 4/2001 | Zahrte, Sr. et al. | |
| 6,693,371 B2 | 2/2004 | Ziegler et al. | |
| 6,795,323 B2 | 9/2004 | Tanaka et al. | |
| 6,838,925 B1 | 1/2005 | Nielsen | |
| 6,894,622 B2 | 5/2005 | Germagian et al. | |
| 6,960,842 B2 | 11/2005 | Ziegler et al. | |
| 7,145,268 B2 | 12/2006 | Edwards et al. | |
| 7,215,535 B2 | 5/2007 | Pereira | |
| 7,275,947 B2 | 10/2007 | Hartel et al. | |
| 7,573,232 B2 * | 8/2009 | Cheng | H02J 9/062 307/64 |
| 7,573,732 B2 | 8/2009 | Teichmann et al. | |
| 7,718,889 B2 | 5/2010 | Rasmussen et al. | |
| 8,552,584 B2 | 10/2013 | Cohen et al. | |
| 8,836,175 B1 | 9/2014 | Eichelberg | |
| 9,201,482 B2 | 12/2015 | Lin | |
| 9,225,262 B2 | 12/2015 | Aaltio | |
| 9,356,409 B2 | 5/2016 | Jansma et al. | |
| 9,531,215 B2 * | 12/2016 | Ewing | H02J 9/06 |
| 9,620,884 B2 | 4/2017 | Borkar et al. | |
| 9,684,349 B2 | 6/2017 | Fallon et al. | |
| 2002/0105230 A1 | 8/2002 | Ziegler et al. | |
| 2004/0027768 A1* | 2/2004 | Rohlfing | H01R 13/707 361/115 |
| 2005/0225914 A1 | 10/2005 | King | |
| 2009/0039706 A1 | 2/2009 | Kotlyar et al. | |
| 2010/0213892 A1 | 8/2010 | Desanctis | |
| 2017/0256984 A1 | 9/2017 | Ding et al. | |
| 2017/0373528 A1* | 12/2017 | Davis | G06F 13/362 |

FOREIGN PATENT DOCUMENTS

| | | |
|---|---|---|
| CN | 207826266 | 9/2018 |
| CN | 105321748 B | 9/2019 |
| DE | 202012009590 | 10/2012 |
| EP | 2706623 A1 | 3/2014 |
| EP | 3484015 | 5/2019 |
| EP | 3487035 | 5/2019 |
| KR | 101287074 | 7/2013 |
| WO | 2004077907 | 9/2004 |
| WO | 2013169650 | 11/2013 |

OTHER PUBLICATIONS

Eaton Powerware series 9155 UPS, product brochure (8 pages) (2010).
Minuteman Uninterruptible Power Supplies "SmarSine" User's Manual, Copyright Para Systems. Inc. (24 pages) (2002).
Mitsubishi Electric Uninterruptible Power Supplies "7011A UPS" product description (6 pages) (2011).
APC by Schneider Electric "Smart-UPS X-Series UPS" Operation Manual (20 pages) (2009).
Toshiba "All Products: Uninterruptible Power Systems" products description (8 pages) (2017).
Vertiv "Liebert GXT4 UPS" Installer/User Guide (66 pages) (2018).
International Search Report and the Written Opinion of the International Searching Authority corresponding to International Patent Application No. PCT/EP2020/025435 (11 pages) (dated Jan. 18, 2021).

* cited by examiner

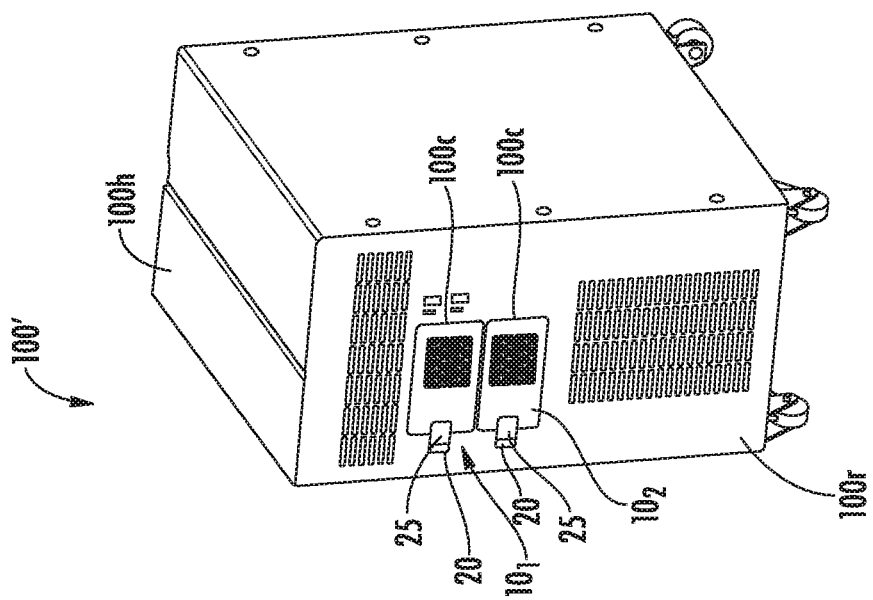
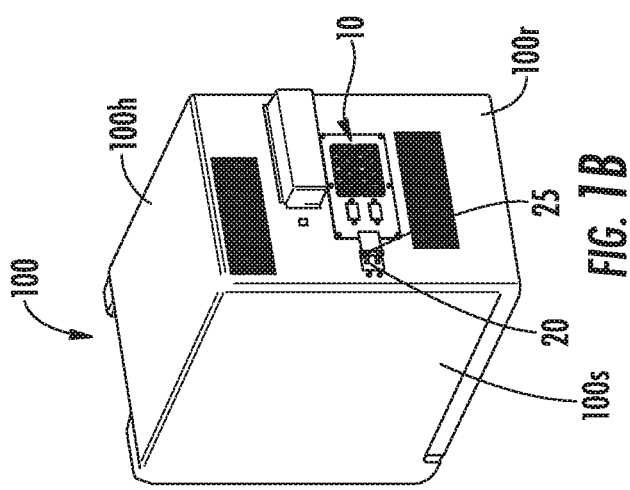
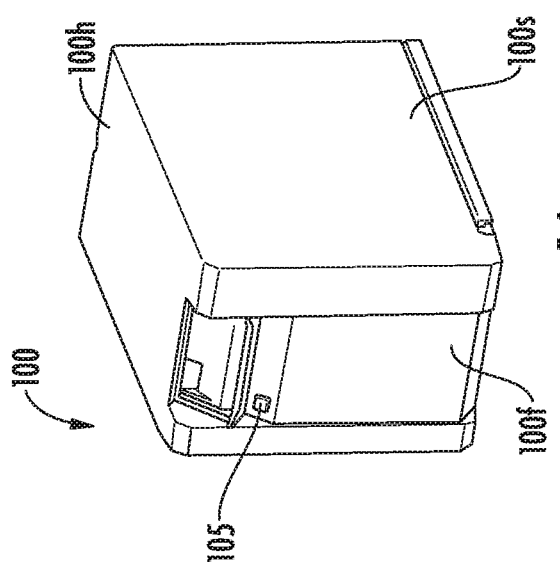
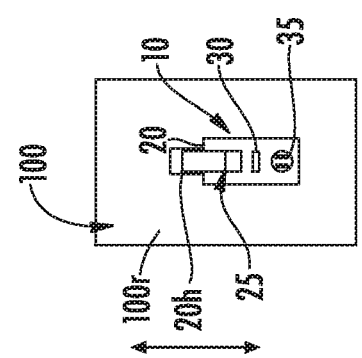
FIG. 1A
FIG. 1B
FIG. 1C
FIG. 2

UNINTERRUPTIBLE POWER SUPPLIES WITH REPLACEABLE RECEPTACLE PANELS AND RELATED METHODS

FIELD OF THE INVENTION

The present invention relates to power supply apparatus and is particularly suitable for uninterruptible power supplies.

BACKGROUND

Universal Power Supply (UPS) systems are commonly used in installations such as data centers, medical centers and industrial facilities. UPS systems may be used in such installations to provide backup power to maintain operation in event of failure of the primary utility supply. These UPS systems commonly have an "on-line" configuration including a rectifier and inverter coupled by a DC link that is also coupled to an auxiliary power source, such as a battery, fuel cell or other energy storage device.

UPS systems commonly use an inverter that generates an AC output from a DC power source, such as a rectifier and/or battery. A "two level" bridge inverter may be used to selectively connect these DC buses to the output of the inverter to generate an AC voltage waveform. Multilevel inverters may provide for additional voltages between the DC bus voltages. Various multilevel inverter circuits are described, for example, in U.S. Pat. No. 5,361,196 to Tamamachi et al., U.S. Pat. No. 6,795,323 to Tanaka et al., U.S. Pat. No. 6,838,925 to Nielsen, U.S. Pat. No. 7,145,268 to Edwards et al., U.S. Pat. No. 7,573,732 to Teichmann et al., and U.S. Pat. No. 9,225,262 to Aaltio, the contents of which are hereby incorporated by reference as if recited in full herein.

UPS systems can include receptacle panels and different users or the same user at different times may desire different layouts or configurations of receptacles on those receptacle panels. In the past, known receptacle panels have been hardwired to terminal blocks in the main unit body and/or configured so that replacement required a power down of the UPS system.

SUMMARY

In some embodiments, an uninterruptible power supply (UPS) system includes a UPS system with a replaceable receptacle panel held in a compartment of the UPS system that can be selectively electrically isolated from a power output path between internal power circuitry and the replaceable panel of the UPS thereby allowing a user to replace the replaceable receptacle panel when the load output path is electrically disconnected from the internal power circuitry even when the UPS system is in an ON state.

Embodiments of the invention provide a UPS power circuit that is configured to selectively electrically isolate (and electrically de-energize) a detachably coupled panel assembly of receptacles to thereby allow safe replacement while the UPS system remains energized and/or at least a portion of the internal power circuitry is energized.

The receptacle panel can be in a de-energized state irrespective of whether onboard circuit breakers are in an ON or OFF state and/or may be configured so that it cannot be powered apart from the UPS system (e.g., the receptacle panels do not have onboard power supplies or power cords that engage power circuits apart from the UPS system).

Embodiments of the invention are directed to a power supply system that includes a housing with power circuitry therein and a power receptacle panel detachably coupled to the housing. The power receptacle panel is electrically coupled to the power circuitry defining a power output path therebetween when the power receptacle panel is coupled to the housing. The power supply system also includes a circuit interrupter provided at least partially in the housing and electrically coupled along the power output path between the power circuitry and the power receptacle panel. The circuit interrupter includes a switch handle that is externally accessible and configured to allow a user to move the switch handle between an ON position of the circuit interrupter, where power is permitted to flow along the power output path from the power circuitry to the power receptacle panel, and an OFF position of the circuit interrupter, where power is prevented from flowing to the power receptacle panel. Only when the circuit interrupter is in the OFF position, is the power receptacle panel detachable from the housing.

The power receptacle panel can be a first power receptacle panel that houses at least one circuit breaker and at least one power receptacle held by the first power receptacle panel. The at least one circuit breaker of the power receptacle panel is positionable in ON and OFF positions and the first power receptacle panel is detachable from the power supply housing while the power supply system is in an ON state and with the at least one circuit breaker housed in the power receptacle panel in either the ON or OFF position.

The circuit interrupter resides in the housing adjacent the power receptacle panel.

The power supply system can further include a second replaceable power receptacle panel that is interchangeably coupled to the housing in place of the first replaceable power receptacle panel thereby allowing a hot swap of the second replaceable power receptacle panel for the first replaceable power receptacle panel.

The power supply system can further include a mechanical interlock coupled to the switch handle of the circuit interrupter and configured to move between (i) a first position associated with the ON position of the circuit interrupter whereby the mechanical interlock physically extends over a portion of the power receptacle panel to prevent the power receptacle panel from being detached from the housing and (ii) a second position associated with the OFF position of the circuit interrupter whereby the mechanical interlock is spaced apart from the power receptacle panel to permit the power receptacle panel to be detached from the housing.

The power receptacle panel can exclude an onboard battery and power cord for powering power receptacles thereon and can only energized to provide power to the power receptacles when installed in the power supply housing with the circuit interrupter in the ON position.

The housing can include a compartment that is adjacent the circuit interrupter and that slidably receives the power receptacle panel.

The compartment that receives the power receptacle panel can include a recess that extends inwardly and further includes a power connector. The power connector can be aligned with and configured to be electrically coupled to a connector extending from a rear wall of the power receptacle panel thereby electrically coupling of the power receptacle panel to the power circuitry when the circuit interrupter is in the ON position.

The power receptacle panel can be capable of being detached from the housing when the power supply system is in an ON state and/or when at least a portion of the power output path is energized.

The switch handle can define the mechanical interlock.

The mechanical interlock can include a blocking portion comprising a first planar segment in a first plane that merges into a second planar segment that is parallel and in a second plane. The second planar segment can be shorter than the first planar segment.

The power receptacle panel can have a primary body with an interior compartment, a rectangular perimeter and a rectangular outer perimeter flange with spaced apart apertures. The housing can have a rectangular compartment having a depth dimension and an adjacent housing outer wall with spaced apart apertures. The rectangular compartment can slidably receive the primary body. Fasteners can extend through aligned apertures in the outer wall and the flange to attach the power receptacle panel to the housing.

In the first position, a portion of the mechanical interlock can abut an outer perimeter portion of the power receptacle panel.

The housing can have a rear wall that is vertically oriented and can have a plurality of spaced apart compartments. The power supply system can have a plurality of the power receptacle panels, one in each of the compartments, and each of the plurality of power receptacle panels can reside adjacent a respective circuit interrupter as the circuit interrupter with the externally accessible switch handle.

The power receptacle panel can exclude an onboard battery and power cord for powering power receptacles thereon and can only be energized to provide power to the power receptacles when installed in the power supply housing with the circuit interrupter ON.

The housing includes a compartment that is adjacent the circuit interrupter and that slidably receives the power receptacle panel. The compartment can be inside a rear wall of the power supply housing.

The switch handle can define the mechanical interlock.

The mechanical interlock can include a blocking portion comprising a first planar segment in a first plane that merges into a second planar segment that is parallel and in a second plane. The second planar segment can be shorter than the first planar segment.

In the first position, the mechanical interlock can extend over an outer surface of an edge portion of the power receptacle panel.

The power receptacle panel can have a primary body with an interior compartment, a rectangular perimeter and a rectangular outer perimeter flange with spaced apart apertures. The housing can have a rectangular compartment having a depth dimension and an adjacent housing outer wall with spaced apart apertures. The rectangular compartment can slidably receive the primary body and fasteners can extend through aligned apertures in the outer wall and the flange to attach the power receptacle panel to the power supply system housing.

In the first position, a portion of the mechanical interlock can abut an outer perimeter portion of the power receptacle panel.

The power supply housing can have a rear wall that is vertically oriented and includes a plurality of spaced apart compartments. The power supply system can have a plurality of the power receptacle panels, one in each of the compartments. Each of the plurality of power receptacle panels can reside adjacent a respective circuit interrupter as the circuit interrupter with the externally accessible switch handle.

The switch handle can pivot side-to-side or up and down between the ON and OFF positions. The mechanical interlock can laterally or longitudinally translate between the first and second positions.

The switch handle can rotate between the ON and OFF positions and the mechanical interlock can rotate between the first and second positions.

Embodiments of the invention are directed to methods of replacing a power receptacle panel of an uninterruptable power supply (UPS) system. The methods include: providing a UPS system with a housing that includes internal power circuitry, a replaceable power receptacle panel held in an externally accessible compartment of the UPS system, and a mechanical interlock configured to block or unblock a portion of the power receptacle panel; moving a circuit interrupter in the housing adjacent the compartment to an OFF position to de-energize the replaceable power receptacle panel; moving the mechanical interlock to unblock the portion of the replaceable power receptacle panel; then removing the replaceable power receptacle panel from the compartment of the UPS system; then installing another replaceable power receptacle panel in the compartment of the UPS system; moving the circuit interrupter to an ON position to energize power receptacles of the other replaceable power receptacle panel; and moving the mechanical interlock to block a portion of the other replaceable power receptacle panel to prevent removal thereof when the circuit interrupter is in the ON position.

The moving the circuit interrupter to the OFF position and the moving the mechanical interlock to unblock the portion of the replaceable power receptacle panel can be concurrently carried out whereby movement of a handle of the circuit breaker to the OFF position automatically moves the mechanical interlock to unblock the portion of the replaceable power receptacle panel.

The moving the circuit interrupter to the ON position and the moving the mechanical interlock to block the portion of the replaceable power receptacle panel can be concurrently carried out whereby movement of the handle of the circuit breaker to the ON position automatically moves the mechanical interlock to block the portion of the replaceable power receptacle panel.

The replaceable power receptacle panel can only be energized when installed in the compartment with the circuit interrupter in the ON position.

The replaceable power receptacle panel can have a back side with a connector. The method can further include slidably mating the connector with an aligned receiving connector in the compartment to couple the power receptacle panel to a power output path defined between the aligned receiving connector and the internal power circuitry when the circuit interrupter is OFF.

The step of moving the mechanical interlock to block a portion of the other replaceable power receptacle panel comprises moving the mechanical interlock in response to translation of a switch handle of the circuit interrupter to place the mechanical interlock over a portion of the replaceable power receptacle panel when the circuit interrupter is in the ON position associated with conduction from the UPS power source to block a user from removing the replaceable power receptacle panel.

The mechanical interlock can be defined by or affixed to an arm of a switch handle of the circuit interrupter and moves between blocked and unblocked positions in response to movement of the switch handle of the circuit interrupter between ON and OFF positions to automatically block and unblock the power receptacle panel.

Other embodiments are directed to a power supply system that includes: a housing defining at least one compartment that contains a connector, power circuitry in the housing coupled. The power circuitry is coupled to the connector defining a power output path therebetween. The power supply system also includes a replaceable receptacle panel with a panel connector that is detachably coupled to the connector in the compartment and a circuit interrupter provided in the housing adjacent to the replaceable receptacle panel and electrically coupled along the power output path between the connector in the compartment and the power circuitry. The circuit interrupter includes a switch handle that is externally accessible and configured to allow a user to move the switch handle between an ON position, where power provided along the power output path is uninterrupted, and an OFF position, where power along the power output path is interrupted to electrically isolate the replaceable receptacle panel from the power circuitry. The power supply system further includes a mechanical interlock coupled to the switch handle. When the switch handle of the circuit interrupter is in the OFF position, the replaceable power receptacle is removable from the compartment of the housing. When the switch handle of the circuit interrupter is in the ON position, the mechanical interlock blocks at least a portion of the replaceable receptacle panel to prevent removal of the replaceable receptacle panel from the compartment of the housing.

The replaceable receptacle panel can be capable of being removed from the housing when the switch handle of the circuit interrupter is in the OFF position, and when the power supply system is in an ON state and/or when at least a portion of the power output path is energized.

The mechanical interlock can be spaced apart from the replaceable receptacle panel when the switch handle the circuit interrupter is in the OFF position.

Yet other embodiments are directed to a power supply system that includes: a housing, power circuitry provided in the housing; a replaceable receptacle panel removably coupled to the housing; and a circuit interrupter provided at least partially in the housing. The circuit interrupter is electrically coupled between the power circuitry and the replaceable receptacle panel. The circuit interrupter includes a switch handle that is externally accessible and configured to allow a user to move the switch handle between an ON position, where power is permitted to flow from the power circuitry to the replaceable receptacle panel, and an OFF position, where power is prevented from flowing from the power circuitry to the replaceable receptacle panel. The power supply system also includes an interlock coupled to the switch handle. When the switch handle of the circuit interrupter is in the OFF position, the replaceable receptacle panel is removable from the housing, and when the switch handle of the circuit interrupter is in the ON position, the interlock prevents removal of the replaceable receptacle panel from the housing.

The housing can define or include at least one compartment that contains a connector and the replaceable receptacle panel includes a panel connector that is detachably coupled to the connector in the compartment.

The power circuitry can be electrically coupled to the connector in the compartment defining a power output path therebetween.

The replaceable receptacle panel can be capable of being removed from the housing when the switch handle of the circuit interrupter is in the OFF position and when the UPS system is in an ON state.

The replaceable receptacle panel can be capable of being removed from the housing when the switch handle of the circuit interrupter is in the OFF position and when at least a portion of the power output path is energized.

Further features, advantages and details of the inventive subject matter will be appreciated by those of ordinary skill in the art from a reading of the figures and the detailed description that follow, such description being merely illustrative of the inventive subject matter.

It is noted that aspects of the invention described with respect to one embodiment, may be incorporated in a different embodiment although not specifically described relative thereto. That is, all embodiments and/or features of any embodiment can be combined in any way and/or combination. Applicant reserves the right to change any originally filed claim or file any new claim accordingly, including the right to be able to amend any originally filed claim to depend from and/or incorporate any feature of any other claim although not originally claimed in that manner. These and other objects and/or aspects of the inventive subject matter are explained in detail in the specification set forth below.

BRIEF DESCRIPTION OF THE DRAWINGS

FIG. 1A is a front perspective view illustrating an example power supply system according to some embodiments of the inventive subject matter.

FIG. 1B is a rear perspective view of the power supply system shown in FIG. 1A.

FIG. 1C is a rear view of the device shown in FIG. 1A with an alternative configuration of a replaceable power receptacle panel according to embodiments of the inventive subject matter.

FIG. 2 is a rear perspective view of another example power supply system according to some embodiments of the inventive subject matter.

DETAILED DESCRIPTION OF EMBODIMENTS

Figure 3A:
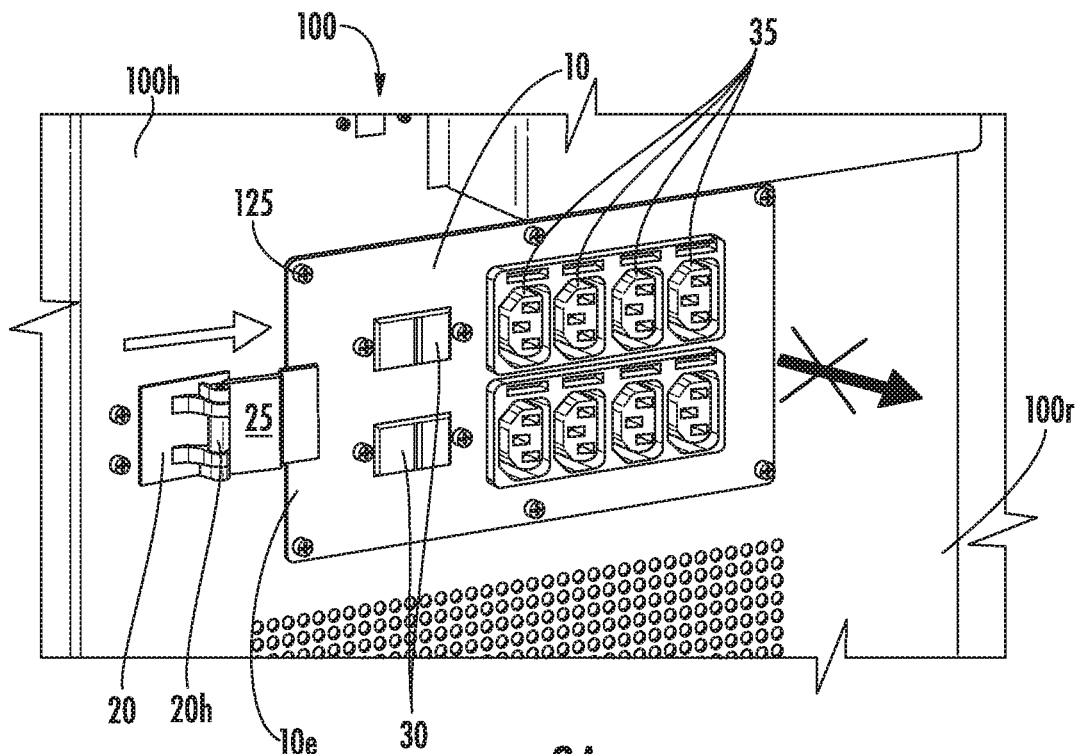
FIG. 3A is a partial rear perspective view of the power supply system illustrating a power receptacle panel in an installed position according to some embodiments of the inventive subject matter.

In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive subject matter.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90° or at other orientations) and the spatially relative descriptors used herein interpreted accordingly.

The term "about", when used with a number, refers to numbers in a range of +/−20% of the noted value(s).

As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present.

As used herein, the term "and/or" includes any and all combinations of one or more of the associated listed items.

The terminology used herein is for the purpose of describing particular embodiments only and is not intended to be limiting of the inventive subject matter. Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

As will be appreciated by one of skill in the art, the inventive subject matter may be embodied as systems, devices and methods. Some embodiments of the inventive subject matter may include hardware and/or combinations of hardware and software. Some embodiments of the inventive subject matter include circuitry configured to provide functions described herein. It will be appreciated that such circuitry may include analog circuits, digital circuits, and combinations of analog and digital circuits.

FIGS. 1A and 1B illustrate a power supply system 100, which can be an uninterruptable power supply (UPS) system, according to some embodiments of the inventive subject matter. The power supply system 100 includes a primary housing 100h, which encloses operational components (not shown). In some embodiments, the enclosed operational components include power circuitry to filter, regulate, condition, and/or convert power, control circuitry, communications circuitry), battery(ies), and/or fan(s) as is well known to those of skill in the art. In other embodiments, the control and/or communications circuitry may be part of the power circuitry. The power supply system 100 can have a front 100f, a rear 100r and side walls 100s as shown.

Figure 7A:
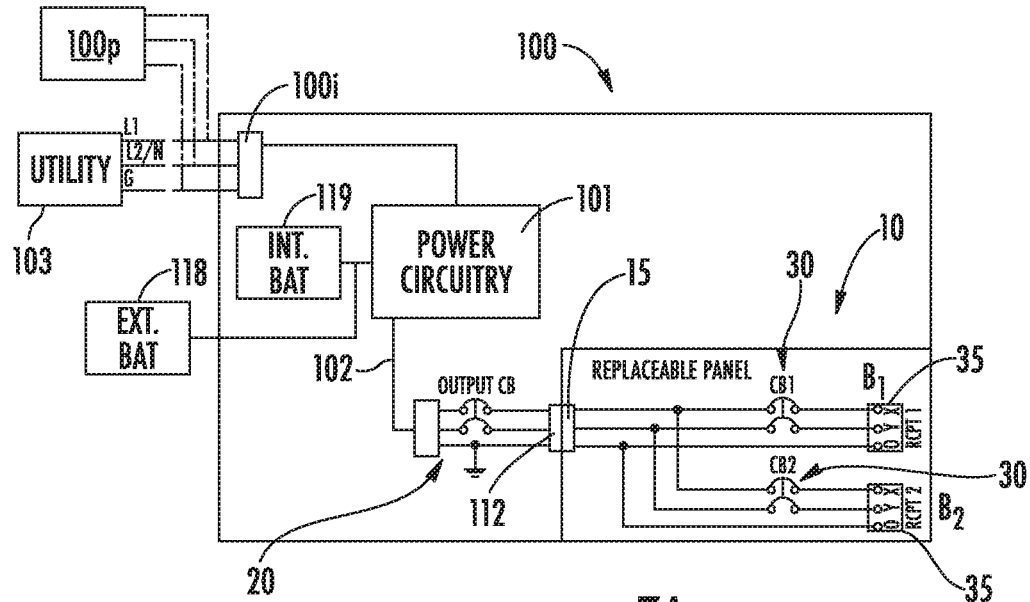
FIG. 7A is a schematic circuit diagram of an example power supply system according to embodiments of the inventive subject matter.

In some embodiments, the power supply system 100 is configured to receive power from a primary power source (e.g., utility power) or a back-up power source (e.g., solar or wind), b) convert, regulate, and/or condition the power via the power circuitry, and c) output the converted, regulated, and/or conditioned power to one or more loads via receptacles coupled to a removable power receptacle panel 10. The power supply system 100 includes a manually actuated circuit interrupter 20 and an associated interlock 25, where the circuit interrupter 20 is electrically coupled along a power output path 102 between the power circuitry 101 and the receptacle panel 10 (FIGS. 7A/7B). When the circuit interrupter 20 is in its ON position, power is provided along the power output path 102 from the power circuitry 101 to the receptacle panel 10 and the associated interlock 25 prevents the receptacle panel 10 from being removed from the power supply system 100. When a user moves the circuit interrupter 20 to its OFF position, power from the power circuitry 101 to the receptacle panel 10 is disconnected along the power output path 102 and the associated interlock 25 allows the receptacle panel 10 to be removed from the power supply system 100, even when the power supply system 100 in an ON state (FIGS. 7A/7B).

As shown in FIG. 1B, the power supply system 100 can include at least one replaceable power receptacle panel 10 ("hereinafter referred to as "receptacle panel 10") shown on the rear or back 100r of the housing 100h. The receptacle panel 10 includes outlets, receptacles, or sockets 35 (hereinafter referred to as "power receptacles 35") for providing power to plug-in cords/cables that can be attached to the power receptacles 35. The receptacle panel 10 is configured to be removable from an installed position (FIG. 3A) to an un-installed, detached, or decoupled position (FIG. 3B).

The power supply system 100 can also include an output circuit interrupter 20 that is mechanically coupled to the housing 100h, with a primary body 20b of the circuit interrupter 20 (FIG. 3A) typically residing inside the housing 100h adjacent the rear wall 100r and adjacent the receptacle panel 10. The circuit interrupter 20 is electrically coupled between the power circuitry 101 within the housing 100h and the receptacle panel 10, typically coupled to the connector 112 inside a compartment 11 (FIG. 3B). The circuit interrupter 20 also includes a switch handle 20h that is configured to be externally accessible and manually operable between an OFF position, where power is not provided to the receptacle panel 10 (i.e., all of the power receptacles 35 are not energized) even when the power circuitry 101 is energized, and an ON position, where power is provided to the receptacle panel 10 (i.e., all of the power receptacles 35 are energized) when the power circuitry 101 is energized.

The circuit interrupter 20 can comprise any electrical disconnect that can electrically interrupt and disconnect power along the power output path 102 between the power circuitry 101 (FIGS. 7A, 7B) and the receptacle panel 10, including a circuit breaker, a fused disconnect switch, contactor and the like. The circuit interrupter 20 can comprise a circuit breaker 120 (FIG. 4A, 7A) that can have an amperage rating in a range of about 50 A-150 A, such as about 50 A, about 75 A, about 100 A, about 125 A and about 150 A, depending on the configuration and needs of a receptacle panel 10.

Figure 3B:
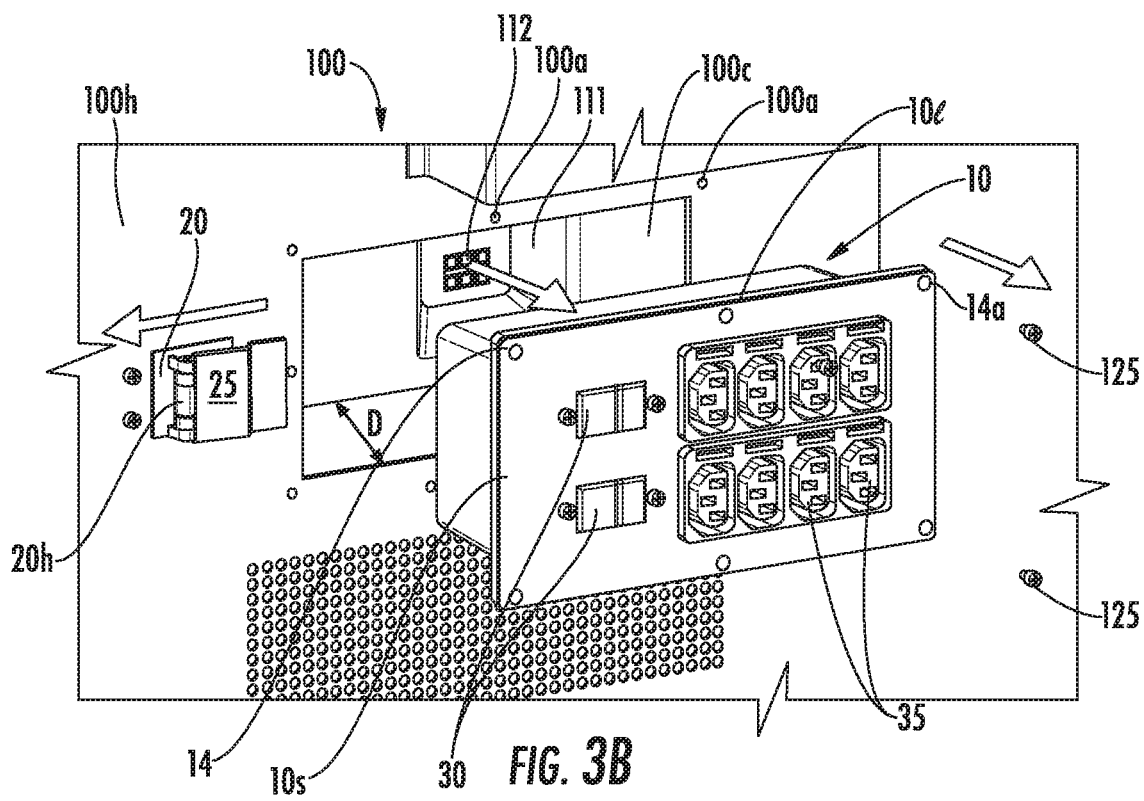
FIG. 3B is a partial exploded view of the power supply system shown in FIG. 3A illustrating replaceable power receptacle panel decoupled from a compartment of the power supply system that holds the power receptacle panel according to some embodiments of the inventive subject matter.
Figure 4A:
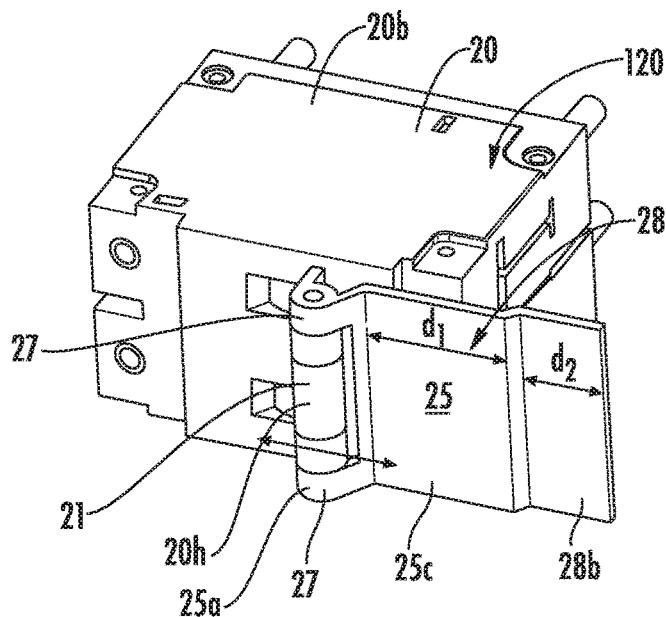
FIG. 4A is a top, front perspective view of an example circuit interrupter with a mechanical interlock according to embodiments of the inventive subject matter.

Referring to FIGS. 3A and 4A, the power supply system 100 includes a mechanical interlock 25 coupled to the switch handle 20h of the circuit interrupter 20 and can move in concert with or substantially in concert with movement of the switch handle 20h of the circuit interrupter 20. For example, when the switch handle 20h of the circuit interrupter 20 is in the ON position, power provided along the power output path 102 is uninterrupted permitting the receptacle panel 10 to be energized and the mechanical interlock 25 is in a blocked position where it is configured to overlie or overlap a portion of the receptacle panel 10 to block or prevent a user from removing the receptacle panel 10. When the switch handle 20h of the circuit interrupter 20 is moved to the OFF position, the mechanical interlock 25 is moved to an unblocked position where the interlock 25 does not overlap the receptacle panel 10 and the circuit interrupter 20 disconnects power along the power output path 102 preventing the receptacle panel 10 from being energized. When the circuit interrupter 20 is in its OFF position and the interlock 25 is in its unblocked position, a user can remove the receptacle panel 10 from the housing 100h (see, FIG. 3B)

The power supply system 100 can have ON and OFF states operated by a user input switch 105 (FIG. 1A). In some embodiments, when the power supply system 100 is connected to a live utility source or back-up power source and is in an OFF state, the power circuitry 101 is configured to prevent power from flowing along the power output path 102 and, in turn, to the receptacle panel 10, even when the circuit interrupter 20 is in the ON position. It will be appreciated that, in some embodiments, a portion of the power circuitry 101 may be energized (e.g., power may be supplied to some or all of the control circuitry and/or communications circuitry where such components are part of the power circuitry), but power is not provided to the receptacle panel 10 even when the circuit interrupter 20 is in the ON position.

In some embodiments, when the power supply system 100 is connected to a live utility source or back-up power source and is in an ON state, the power circuitry 101 is configured to allow power to flow along the power output path 102 to the receptacle panel 10 when the circuit interrupter 20 is in the ON position. However, when the circuit interrupter 20 is moved to the OFF position, power flowing to the receptacle panel 10 is disconnected, which electrically isolates the receptacle panel 10 from the power circuitry 101. It will be appreciated that, although the circuit interrupter 20 de-energizes a portion of the power output path 102 (i.e., between the circuit interrupter 20 and the receptacle panel 10), the portion of the power output path 102 between the power circuitry 101 and the circuit interrupter 20 remains energized. By providing a manually actuated circuit breaker 20 along the power output path 102, a user can replace a faulty receptacle panel 10 with a new panel or replace a receptacle panel 10 with another receptacle panel having receptacles that vary in number, amperage rating, and/or type, even when the power supply system 100 is in an ON state and/or when at least a portion of the power output path 102 is energized, thereby allowing a "hot swap" of the receptacle panel 10.

Figure 5:
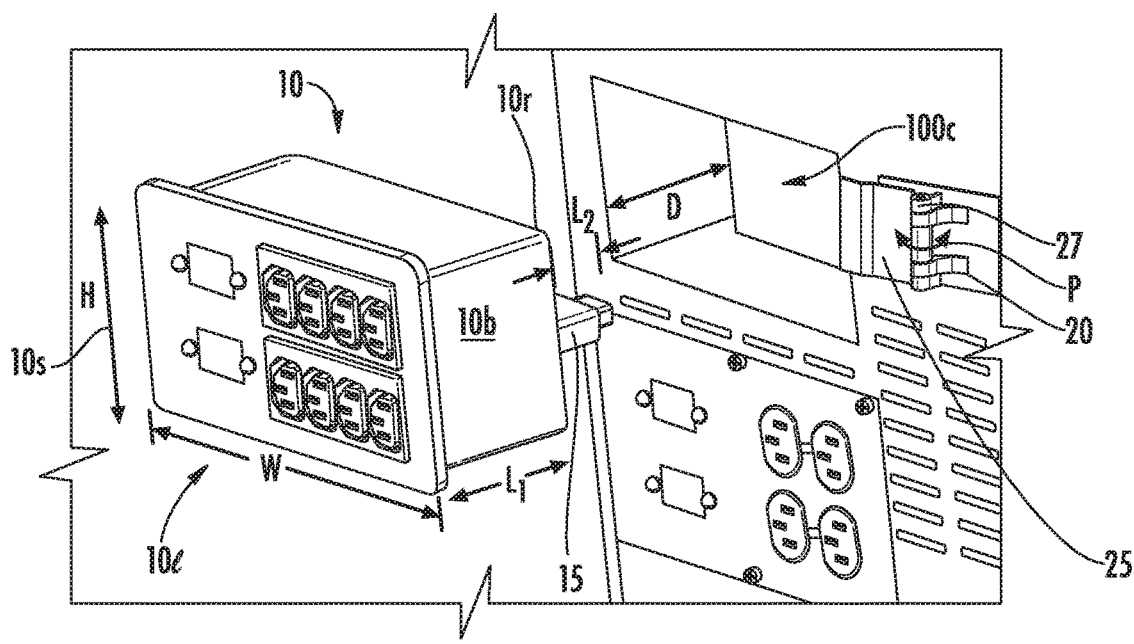
FIG. 5 is a side perspective partial exploded view of the power supply system shown in FIG. 3A but with the mechanical interlock shown at a different location according to embodiments of the inventive subject matter.

In some embodiment, the mechanical interlock 25 can be configured to overlap at least one side portion, at least one edge portion, or at least one end portion 10e of the receptacle panel 10, such as a left side portion as shown in FIG. 3A or a right side portion as shown in FIG. 5.

The interlock 25 can be configured so that it is always on one side of the hinge axis P whether in the blocked or unblocked position (unblocked position shown in FIG. 5).

In some embodiments, the interlock 25 can be rotated from a blocked position and on one side of the hinge axis P to a different side of the hinge axis P in an unblocked position.

The mechanical interlock 25 can be configured to not occlude the power receptacles 35 on the receptacle panel 10.

Figure 4B:
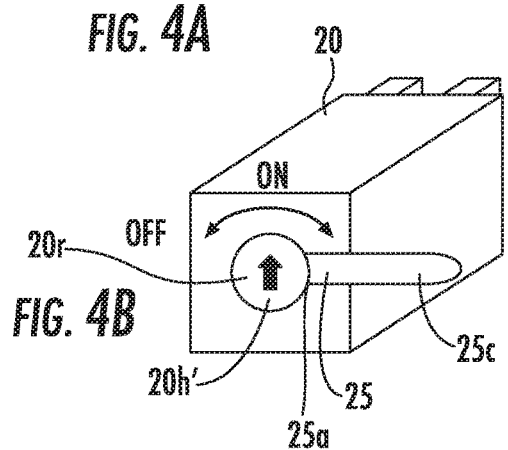
FIG. 4B is a top, front perspective view of another example circuit interrupter with a mechanical interlock according to embodiments of the inventive subject matter.

By way of another example, referring to FIG. 4B, the circuit interrupter 20 can include a rotary switch 20r with a switch handle 20h' and a mechanical interlock 25 with a blocking portion 25c positioned over the receptacle panel 10 when the switch handle 20h' is moved to the ON position. When the switch handle 20h' is moved to the OFF position, the mechanical interlock 25 is moved to an unblocked position where the interlock does not overlap the receptacle panel 10 and a user can remove the receptacle panel 10 from the housing 100h, while the power supply system 100 is an ON or OFF state. FIG. 4B illustrates an example rotary action handle 20h' with the cover portion 25c of the mechanical interlock 25 provided as an arm 25a that extends off the rotary handle 20h'. The arm 25a has sufficient length to block at least a portion of the receptacle panel 10 when the receptacle panel 10 is energized via the connector 112 (FIG. 3B) but not occlude the power receptacles 35.

FIG. 1C illustrates the receptacle panel 10 in a different orientation from that shown in FIG. 1B.

The circuit interrupter(s) 20 and receptacle panel(s) 10 can be oriented with the handle 20h configured to move side to side and the panels oriented with a long dimension horizontal as shown in FIGS. 1B and 2. The circuit interrupter 20 and receptacle panel(s) 10 can be configured in different manners and held in different orientations. For example, the circuit interrupters 20 and respective handles 20h can be oriented to translate up and down and the mechanical interlock 25 can be configured to move up and down to block a portion of the receptacle panel 10 as shown in FIG. 1C. The panel receptacle 10 can be oriented with its long sides horizontal (FIGS. 1B and 2) or with its long sides vertically oriented (FIG. 1C) irrespective of the movement of the switch handle 20h.

FIG. 2 illustrates that the power supply system 100' can comprise a plurality of spaced apart receptacle panels $10_1$, $10_2$, (shown as two) each configured to mechanically and electrically couple to a respective circuit interrupter $20_1$, $20_2$ when in position in the power supply system 100.

FIG. 4A illustrates one embodiment of the mechanical interlock 25. In the illustrated embodiment, the mechanical interlock 25 is coupled to the switch handle 20h of the circuit interrupter 20 and configured for coordinated movement with the switch handle 20h (i.e., movement of mechanical interlock 25 is dependent on movement of the switch handle 20h). When the switch handle 20h is moved or translated in a side-to-side motion as shown in FIG. 4A (see handle movement arrow in FIG. 4A) between ON and OFF positions, the mechanical interlock 25 is translated between blocked and unblocked positions, respectively, with respect to the receptacle panel 10. In alternative embodiments, the switch handle 20h can be configured as an up-down handle (FIG. 1C) or a rotary handle (FIG. 4I), by way of example.

As shown in FIG. 4A, the mechanical interlock 25 includes an attachment portion 25a, which is coupled to a cylindrical arm 21 of the switch handle 20h, and a cover portion 25c. The attachment portion 25a of the mechanical interlock 25 includes at least one attachment segment 27 (shown as two adjacent attachment segments in FIG. 4A) that couples to the arm 21. The at least one attachment segment 27 can be attached to the arm 21 in any suitable manner, typically so that the arm 21 and the at least one attachment segment 27 move totally or substantially in concert. The at least one attachment segment 27 can be affixed to the arm 21, for example, via adhesive, mechanical fixation (pins/screws), frictional engagement and combinations thereof. The at least one attachment segment 27 can rotate slightly relative to the arm 21 during movement of the mechanical interlock 25. The cover portion 25c of the mechanical interlock 25 can have a planar blocking member 28 that can include a first planar segment 28a that merges into a second planar segment 28b. The second planar segment 28b can reside in a plane that is offset but parallel to the plane of the first planar segment 28a. The second planar segment 28b can reside closer to the plane of the outer surface of the receptacle panel 10 than the first planar segment 28a. The second planar segment 28b can extend a distance $d_2$ that is shorter than the extent $d_1$ of the first planar segment 28a.

Referring to FIG. 3B, the receptacle panel 10 can be rectangular and have a pair of long sides 10l joined by a pair of short sides 10s. The receptacle panel 10 can include one or more circuit breakers 30 and these circuit breakers 30 can be in either an ON or OFF position when removing and replacing a respective receptacle panel 10 and the at least one circuit breaker 30 can be in an ON or OFF position, while the power receptacle panel 100 is removed from the power supply housing 100h without affecting the electrical isolation of the respective receptacle panel 10.

As shown in FIGS. 3B and 5, the housing 100h can include at least one inwardly extending compartment 100c defined by side and inner walls that is sized and configured to receive and hold a respective receptacle panel 10 with the power receptacles 35 facing outward and externally accessible when the receptacle panel 10 is in its installed position in the compartment 100c.

The compartment 100c can reside adjacent a respective circuit interrupter 20 with the handle 20h coupled to the mechanical interlock 25. Where more than one compartment 100c is provided, such compartments can be adjacent and laterally spaced apart, adjacent and longitudinally spaced apart, or stacked one above another, optionally aligned in a column (see, FIG. 2). Additionally, where more than one compartment 100c is provided, the compartments 100c can be staggered and/or misaligned.

Referring back to FIG. 3B, the receptacle panel 10 can be removably attached to the housing 100h via fasteners 125, shown as six spaced apart fasteners 125, which are received by apertures 14a in an outer perimeter flange 14 of power receptacle panel 10 and corresponding apertures 100a in the rear wall 100r surrounding a respective compartment 100c. The power receptacles 35 and the handle 20h of the circuit interrupter 20 can be externally accessible as shown in FIGS. 1B, 2 and 3A, for example.

The compartment 100c can have a depth "D" that is typically between 2-5 inches, such as about 3 inches, in some embodiments. The compartment 100c can be configured so that the front facing surface of the receptacle panel 10 with the power receptacles 35 is flush or substantially flush with a wall, such as the rear wall 100r, of the housing 100h and externally accessible. The receptacle panel 10 may also be configured to protrude or be recessed in the compartment 100c while allowing external access to the power receptacles 35 of the receptacle panel 10.

The compartment 100c of the housing 100h can have an inner wall with a recess 111 that houses a connector 112 that is electrically coupled to the internal power circuit (also interchangeably called "power circuitry") 101 of the power supply 100. The recess 111 can have a depth that is between 0.5 inches and 2 inches, typically about 1 inch.

As shown in FIG. 5, the receptacle panel 10 can include a connector 15, such as, e.g., a "finger safe" blind side connector, that is configured to engage and be electrically coupled to the connector 112 when the receptacle panel 10 is in an installed position (see FIG. 3A). The connector 15 can be rigid or semi-rigid and project outward from a rear 10r of the receptacle panel 10. The term "semi-rigid" means that the connector 15 has a self-supporting shape, but may flex under normal load/forces. The connector 15 can be sized and configured to align with the recess 111 in the compartment 100c and couple to/with the connector 112 when the receptacle panel 10 is moved to the installed position. When the receptacle panel 10 is removed and the circuit interrupter 20 is in the OFF position, the compartment 100c is electrically isolated from the power circuit 101.

The receptacle panel 10 can have a depth dimension length "$L_1$" of between 2-4 inches, typically about 3 inches. The connector 15 can project outward from a rear 10r of the receptacle panel 10 a length "$L_2$": $L_1 > L_2$. In some embodiments, $L_2$ is in a range of about 0.5 and 1.5 inches, typically about 1 inch.

Figure 6:
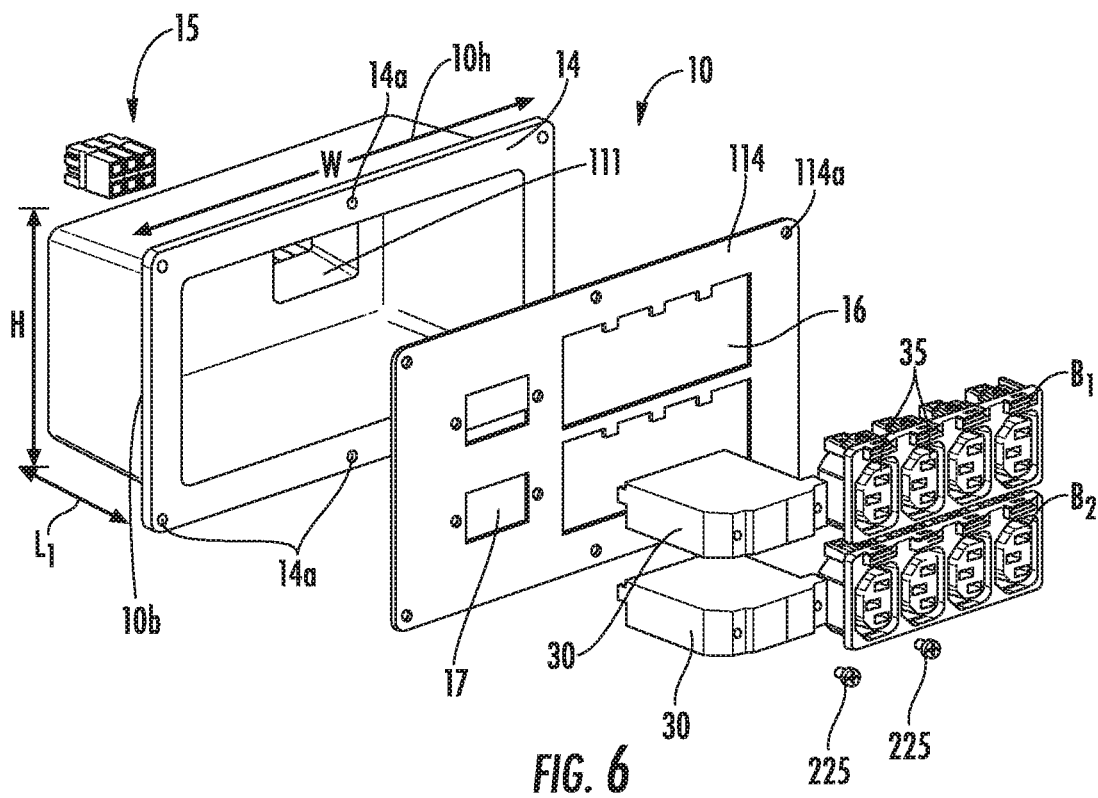
FIG. 6 is a front perspective exploded view of an example power receptacle panel according to embodiments of the inventive subject matter.

Referring to FIGS. 3B, 5 and 6, the receptacle panel 10 can have a housing 10h with a primary body 10b having a height H, a width W and a depth $L_1$. The width W may define a long or short dimension. The long dimension 10l can be in a range of 4-12 inches, typically about 8 inches. As discussed above, the receptacle panel 10 can be oriented with its long dimension 10l horizontally oriented as shown but may alternatively be oriented with its long dimension 10l horizontally oriented.

The receptacle panel 10 can be "cold" so as not to be able to energize or power the receptacles 35 unless installed in the compartment 100c of the power supply system 10 with a respective circuit interrupter 20 in an ON position. That is, there is typically no onboard battery or plug-in power cords or dongles of the receptacle panel 10 that allow the power receptacles 35 to be powered by an external power source.

Referring to FIG. 6, the receptacle panel 10 can include a primary body 10b defining the compartment 100c and the recess 111 that holds the connector 15. The primary body 10b can include the flange 14 with the apertures 14a for fastening the receptacle panel 10 to the rear wall 10r of the power supply system 100. The receptacle panel 10 can also include a planar member 114 (or plate) that defines an external outer facing surface and includes apertures 114a that align with the apertures 14a in the flange 14 of the primary body 10b. The planar member 114 can include at least one window that is configured to receive at least one gang or bank of power receptacles, e.g., FIG. 6 shows two gangs or banks $B_1$, $B_2$ of power receptacles 35 received in respective windows 16, and at least one smaller window configured to receive at least one circuit interrupter or circuit breaker, e.g., FIG. 6 shows two circuit breakers 30 received in smaller windows 17 to permit access to at least a portion of each circuit breaker 30. Each circuit breaker 30 is electrically coupled between the connector 15 and one of the banks $B_1$, $B_2$ of power receptacles 35 and configured to interrupt power provided to such bank of power receptacles 35. Fixation members 225 (e.g., screws) can be used to attach the circuit breaker 30 to the planar member 114.

FIG. 7A is a schematic illustration of one embodiment of a power supply system 100. As shown in FIG. 7A, a utility power source 103 and an optional back-up power source 100p is connected to a common input port 100i of the power supply system 100. The input port 100i can include inputs L1 (line 1), L2/N (line 2 or neutral) and ground G. The input port 100i is coupled to the input of power circuitry 101, which is configured to, among other things, filter, regulate, condition and/or convert AC and/or DC power. The output of the power circuitry 101 is coupled to the input of the circuit interrupter 20, while the output of the circuit interrupter 20 is electrically coupled to connector 112 provided in a compartment 100c of the housing 100h. In this embodiment, the electrical path between the output of the power circuitry 101 and the connector 112 provided in compartment 100c of the housing 100h defines a power output path 102 and the circuit interrupter 20 is provided along the power output path 102 to interrupt power along this path.

Power receptacles 35 on receptacle panel 10 are electrically coupled to connector 15 provided on the receptacle panel 10. The connector 112 and the connector 15 are configured to be connected to each other and be detachable from each other.

When the power supply system 100 is in the ON state, the receptacle panel 10 is in the installed position, and the circuit interrupter 20 is in the ON position, power is provided from either the utility power source 103 or the secondary (backup) power supply 100p to the power circuitry 101 and then outputted along the power output path 102 to the receptacle panel 10 to energize the power receptacles 35. When the power supply system 100 is in the ON state, the receptacle panel 10 is in the installed position, and the circuit interrupter 20 is in the OFF position, power is provided from either the utility power source 103 or the secondary (backup) power supply 100p to the power circuitry 101 and then outputted to the power output path 102. However, because the circuit interrupter 20 is in the OFF position, the circuit interrupter 20 disconnects power along the power output path 102 and electrically isolates the receptacle panel 10 from the power circuitry 101, thereby de-energizing the receptacle panel 10. This permits the receptacle panel 10 it to be removed from the power supply system 100 by removing screws 125 and then disconnecting the connector 15 on the receptacle panel 10 from the connector 112 housed in the compartment 100c.

The circuit interrupter 20 can have a one, two or three pole configuration dependent on the number of phases desired for a particular receptacle panel 10. The receptacle panel 10 can be configured for single, split or three phases.

In one embodiment, the power circuitry 101 can be configured with a ferro-resonant UPS topology, which includes a ferro-resonant transformer at the output and an inverter coupled between a backup DC power source (e.g., an internal and/or external battery) and the ferro-resonant transformer. See, e.g., U.S. Pat. No. 6,218,744, the contents of which are hereby incorporated by reference as if recited in full herein. The ferro-resonant transformer can filter the input voltage and regulate the output voltage and may also be configured to correct power factor and distortion. When working on battery, the inverter (e.g., a simple full bridge (H-Bridge) inverter) can be used to power the ferro-resonant transformer, which in turn supports the load. In other embodiments, the power circuitry 101 can be configured with a line-interactive UPS topology, a stand-by UPS topology, a double conversion UPS topology, or any other known UPS topologies, each of which includes power circuitry that typically includes at least an inverter to convert DC power from an internal or external battery) to AC power.

Figure 7B:
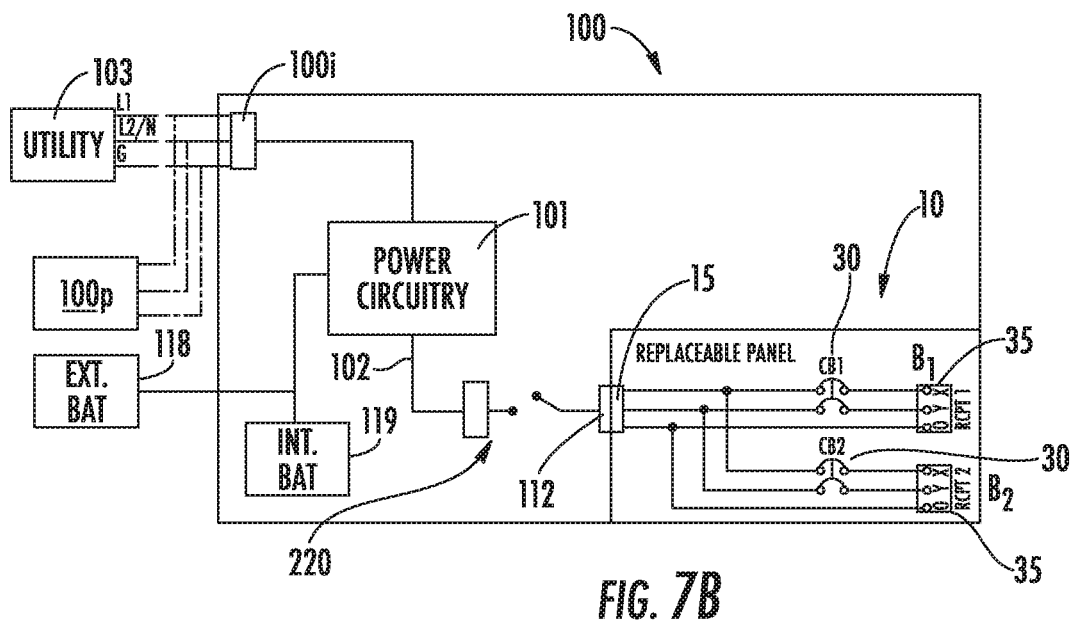
FIG. 7B is another schematic circuit diagram of a power supply system according to embodiments of the inventive subject matter.

As shown in FIG. 7A, the power supply system 100 can include an external battery module 118 that is coupled to the inverter (not shown) of the internal power circuitry 101. Alternatively, the power supply system 100 can include an internal battery or battery bank 119 coupled to the inverter of the internal power circuitry 101. In another embodiment, the power supply system 100 can include both an external battery 118 and an internal battery or battery bank 119. FIG. 7A illustrates that the circuit interrupter 20 can comprise a circuit breaker 120, while FIG. 7B illustrates that the circuit interrupter can comprise a (fused) disconnect switch 220 that is coupled to the mechanical interlock 25 (not shown). Thus, as shown in FIG. 7B, the circuit interrupter can include a disconnect switch 220 instead of a circuit breaker.

Figure 8:
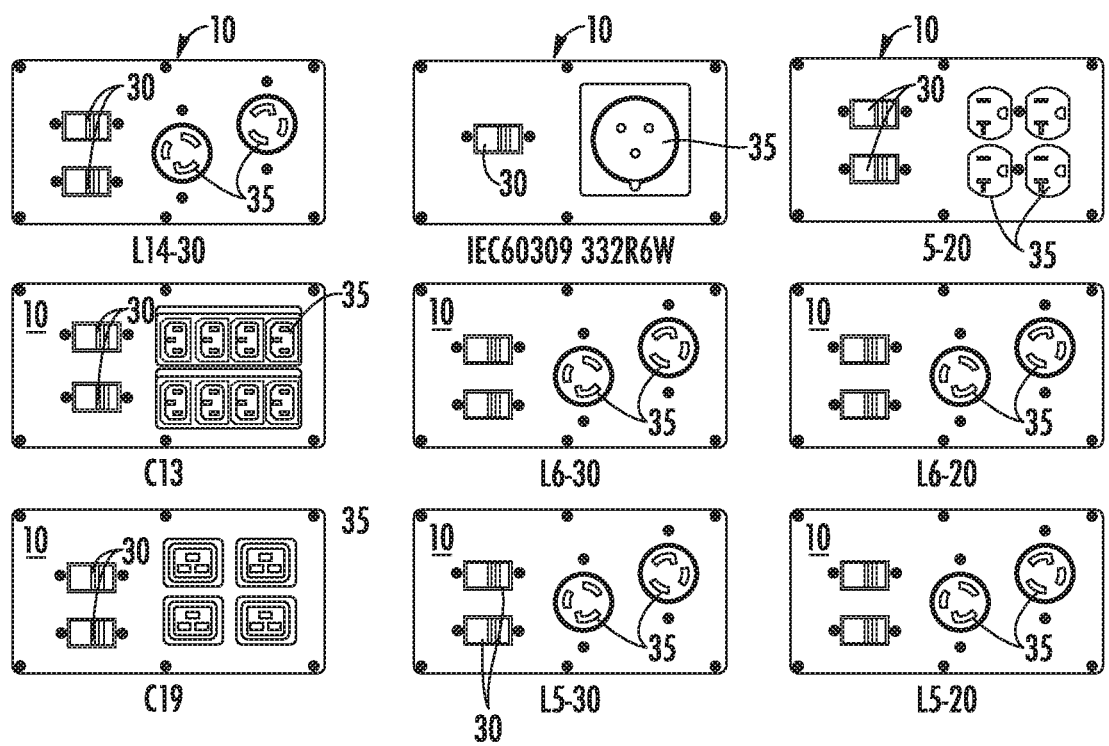
FIG. 8 are front views of examples of different power receptacle panel configurations according to some embodiments of the inventive subject matter.

FIG. 8 illustrates examples of different receptacle panels 10 that can be mounted in a compartment 100c of the power supply system 100. Each receptacle panel 10 can be detachably, interchangeably or removably coupled to a compartment 100c of the power supply system 100, when the power supply system 100 is in an ON state and/or at least a portion of a power output path between the power circuitry and the receptacle panel is energized and when power is disconnected along that power output path (e.g., by a circuit interrupter). Each receptacle panel 10 can include an arrangement of different types, amperage ratings, or numbers of power receptacles 35. The power supply system 100 (e.g., UPS) can allow a customer to choose the type of power receptacles that meet their local demands at the end-use facility where the UPS is deployed using user selectable receptacle panels 10.

Figure 9:
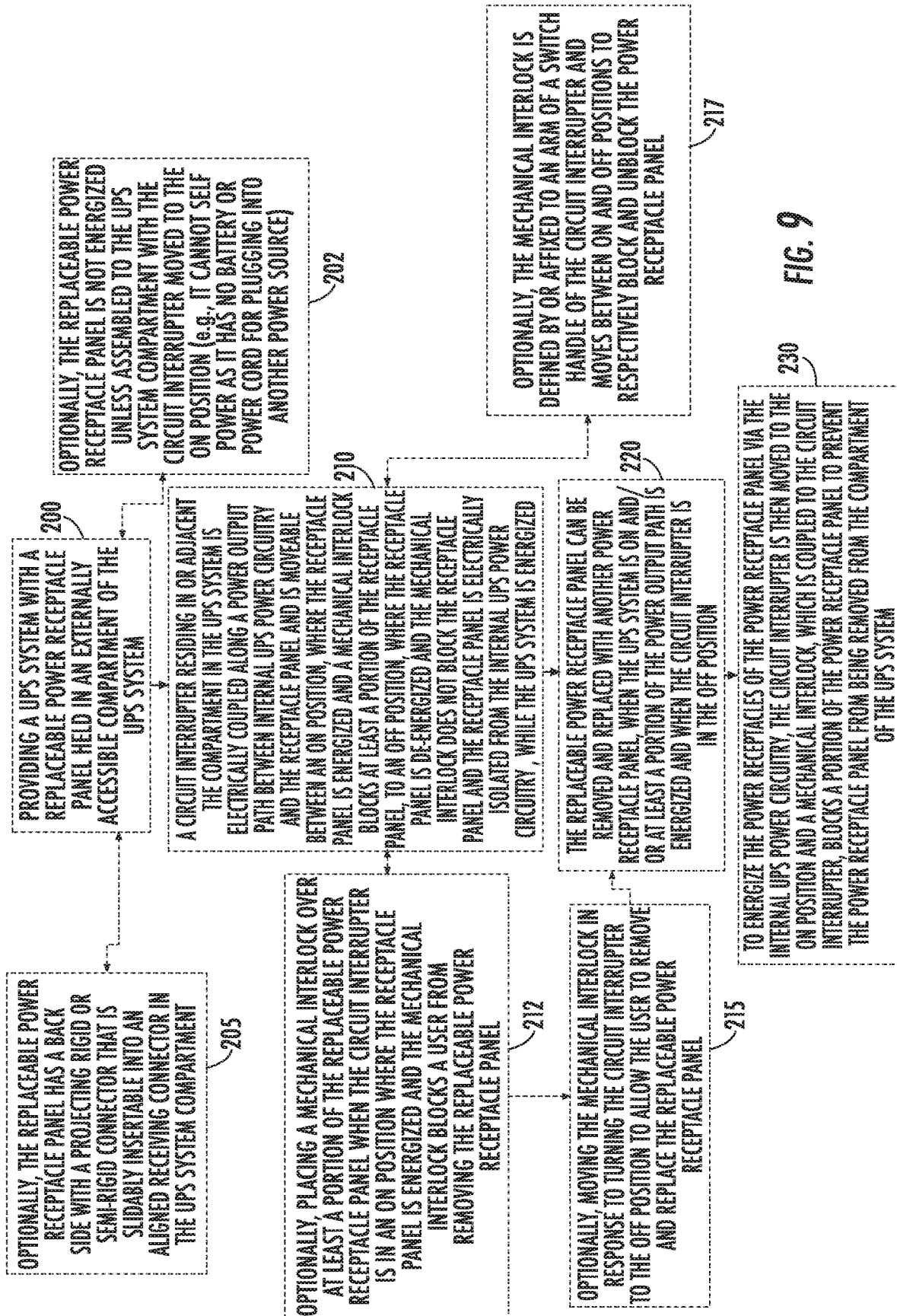
FIG. 9 is a flowchart illustrating operations for replacing a power receptacle panel according to some embodiments of the inventive subject matter.

FIG. 9 illustrates a flow chart of exemplary actions for replacing a receptacle panel of a UPS that can be carried out according to some embodiments of the inventive subject matter.

A power supply system, e.g., a UPS system, is provided. The UPS system has a replaceable power receptacle panel held in an externally accessible compartment of the UPS system (block 200). A circuit interrupter residing in or adjacent the compartment in the UPS system is electrically coupled along an power output path between internal UPS power circuitry and the receptacle panel and is moveable between an ON position, where the receptacle panel is energized and a mechanical interlock blocks at least a portion of the receptacle panel, to an OFF position, where the receptacle panel is de-energized and the mechanical interlock does not block the receptacle panel and the receptacle panel is electrically isolated from the internal UPS power circuitry, while the UPS system is energized (block 210).

The replaceable power receptacle panel can be removed and replaced with another power receptacle panel, when the UPS system is ON and/or at least a portion of the power output path is energized and when the circuit interrupter is in the OFF position (block 220).

To energize the power receptacles of the power receptacle panel via the internal UPS power circuitry, the circuit interrupter is then moved to the ON position and a mechanical interlock, which is coupled to the circuit interrupter, blocks a portion of the power receptacle panel to prevent the power receptacle panel from being removed from the compartment of the UPS system (block 230).

Optionally, the replaceable power receptacle panel is not energized unless it is installed in the UPS system compartment with the circuit interrupter moved to the ON position (e.g., it cannot self-power as it has no battery or power cord for plugging into another power source) (block 202).

Optionally, the replaceable power receptacle panel has a back side with a projecting rigid or semi-rigid connector that is slidably engageable with an aligned receiving connector in the UPS system compartment (block 205).

Optionally, the mechanical interlock is placed over at least a portion of the replaceable power receptacle panel when the circuit interrupter is in the ON position, where the receptacle panel is energized and the mechanical interlock blocks a user from removing the replaceable power receptacle panel (block 212).

Optionally, the mechanical interlock is moved in response to moving the circuit interrupter to the OFF position to allow the user to remove and replace the replaceable power receptacle panel (block 215).

Optionally, the mechanical interlock is defined by or affixed to an arm of a switch handle of the circuit interrupter and moves between ON and OFF positions to respectively block and unblock the power receptacle panel (block 217).

In the drawings and specification, there have been disclosed exemplary embodiments of the inventive subject matter. Although specific terms are employed, they are used in a generic and descriptive sense only and not for purposes of limitation, the scope of the inventive subject matter being defined by the following claims.

That which is claimed:

1. A power supply system comprising:
a housing comprising power circuitry therein;
a power receptacle panel detachably coupled to the housing, wherein the power receptacle panel is electrically coupled to the power circuitry defining a power output path therebetween when the power receptacle panel is coupled to the housing; and
a circuit interrupter provided at least partially in the housing and electrically coupled along the power output path between the power circuitry and the power receptacle panel, wherein the circuit interrupter comprises a switch handle that is externally accessible, non-detachably mounted to the housing, and configured to allow a user to move the switch handle between an ON position of the circuit interrupter, where power is permitted to flow along the power output path from the power circuitry to the power receptacle panel, and an OFF position of the circuit interrupter, where power is prevented from flowing to the power receptacle panel,
wherein, only when the circuit interrupter is in the OFF position, is the power receptacle panel detachable from the housing.

2. A power supply system comprising:
a housing comprising power circuitry therein;
a power receptacle panel detachably coupled to the housing, wherein the power receptacle panel is electrically coupled to the power circuitry defining a power output path therebetween when the power receptacle panel is coupled to the housing; and
a circuit interrupter provided at least partially in the housing and electrically coupled along the power output path between the power circuitry and the power receptacle panel, wherein the circuit interrupter comprises a switch handle that is externally accessible and configured to allow a user to move the switch handle between an ON position of the circuit interrupter, where power is permitted to flow along the power output path from the power circuitry to the power receptacle panel, and an OFF position of the circuit interrupter, where power is prevented from flowing to the power receptacle panel,
wherein, only when the circuit interrupter is in the OFF position, is the power receptacle panel detachable from the housing,
wherein the power receptacle panel is a first power receptacle panel that comprises a first power receptacle panel housing that houses at least one circuit breaker and at least one power receptacle held by the first power receptacle panel, wherein the at least one circuit breaker of the first power receptacle panel is positionable in ON and OFF positions, and wherein the first power receptacle panel housing is detachable from the power supply system housing while the power supply system is in an ON state and with the at least one circuit breaker housed in the first power receptacle panel housing in either the ON or OFF position.

3. The power supply system of claim 1, wherein the circuit interrupter resides in the housing adjacently above, below or to a side of the power receptacle panel, electrically coupled along the power output path between a connector in a compartment that releasably receives the power receptacle panel and the power circuitry.

4. The power supply system of claim 2, wherein the first power receptacle panel is a first replaceable power receptacle panel, the system further comprising a second replaceable power receptacle panel that comprises a second power receptacle panel housing and that is interchangeably coupled to the power supply system housing in place of the first replaceable power receptacle panel, thereby allowing a hot swap of the second replaceable power receptacle panel for the first replaceable power receptacle panel.

5. The power supply system of claim 1, further comprising a mechanical interlock affixed to the housing to be externally accessible, coupled to the switch handle of the circuit interrupter and configured to move between (i) a first position associated with the ON position of the circuit interrupter whereby the mechanical interlock physically extends over a portion of the power receptacle panel to prevent the power receptacle panel from being detached from the housing and (ii) a second position associated with the OFF position of the circuit interrupter whereby the mechanical interlock is spaced apart from the power receptacle panel to permit the power receptacle panel to be detached from the housing.

6. The power supply system of claim 1, wherein the power receptacle panel excludes an onboard battery and power cord for powering power receptacles thereon and is only energized to provide power to the power receptacles when installed in the power supply housing with the circuit interrupter in the ON position.

7. The power supply system of claim 1, wherein the housing comprises a compartment that is adjacent the circuit interrupter and that slidably receives a power receptacle panel housing comprising the power receptacle panel.

8. The power supply system of claim 1, wherein the power receptacle panel is capable of being detached from the housing when the power supply system is in an ON state and/or when at least a portion of the power output path is energized.

9. The power supply system of claim 5, wherein the switch handle defines the mechanical interlock.

10. A power supply system comprising:
a housing comprising power circuitry therein;
a power receptacle panel detachably coupled to the housing, wherein the power receptacle panel is electrically coupled to the power circuitry defining a power output path therebetween when the power receptacle panel is coupled to the housing;
a circuit interrupter provided at least partially in the housing and electrically coupled along the power output path between the power circuitry and the power receptacle panel, wherein the circuit interrupter comprises a switch handle that is externally accessible and configured to allow a user to move the switch handle between an ON position of the circuit interrupter, where power is permitted to flow along the power output path from the power circuitry to the power receptacle panel, and an OFF position of the circuit interrupter, where power is prevented from flowing to the power receptacle panel; and
a mechanical interlock coupled to the switch handle of the circuit interrupter and configured to move between (i) a first position associated with the ON position of the circuit interrupter whereby the mechanical interlock physically extends over a portion of the power receptacle panel to prevent the power receptacle panel from being detached from the housing and (ii) a second position associated with the OFF position of the circuit interrupter whereby the mechanical interlock is spaced apart from the power receptacle panel to permit the power receptacle panel to be detached from the housing,
wherein, only when the circuit interrupter is in the OFF position, is the power receptacle panel detachable from the housing, and
wherein the mechanical interlock includes a blocking portion comprising a first planar segment in a first plane that merges into a second planar segment that is parallel and in a second plane, and wherein the second planar segment is shorter than the first planar segment.

11. The power supply system of claim 1, wherein the power receptacle panel has a primary body with an interior compartment, a rectangular perimeter and a rectangular outer perimeter flange comprising spaced apart apertures, wherein the housing comprises a rectangular compartment having a depth dimension and an adjacent housing outer wall with spaced apart apertures, wherein the rectangular compartment occupies a subset of a length and/or lateral dimension of the housing and slidably receives the primary body, and wherein fasteners extend through aligned apertures in the outer wall and the flange to attach the power receptacle panel to the housing.

12. A power supply system comprising:
a housing comprising power circuitry therein;
a power receptacle panel detachably coupled to the housing, wherein the power receptacle panel is electrically coupled to the power circuitry defining a power output path therebetween when the power receptacle panel is coupled to the housing;
a circuit interrupter provided at least partially in the housing and electrically coupled along the power output path between the power circuitry and the power receptacle panel, wherein the circuit interrupter comprises a switch handle that is externally accessible and configured to allow a user to move the switch handle between an ON position of the circuit interrupter, where power is permitted to flow along the power output path from the power circuitry to the power receptacle panel, and an OFF position of the circuit interrupter, where power is prevented from flowing to the power receptacle panel; and
a mechanical interlock coupled to the switch handle of the circuit interrupter and configured to move between (i) a first position associated with the ON position of the circuit interrupter whereby the mechanical interlock physically extends over a portion of the power receptacle panel to prevent the power receptacle panel from being detached from the housing and (ii) a second position associated with the OFF position of the circuit interrupter whereby the mechanical interlock is spaced apart from the power receptacle panel to permit the power receptacle panel to be detached from the housing,
wherein, only when the circuit interrupter is in the OFF position, is the power receptacle panel detachable from the housing, and
wherein, in the first position, a portion of the mechanical interlock abuts an outer perimeter portion of the power receptacle panel.

13. The power supply system of claim 1, wherein the housing comprises a rear wall that is vertically oriented and comprises a plurality of spaced apart compartments, each compartment with a connector that is coupled to the power circuitry, wherein the power supply system comprises a plurality of the power receptacle panels, one in each of the compartments, wherein each of the plurality of power receptacle panels comprises a power receptacle panel housing with an outwardly projecting power connector that aligns with a respective connector in the compartment, and wherein each of the power receptacle panel housings resides adjacent a respective circuit interrupter as the circuit interrupter with the externally accessible switch handle.

14. A method of replacing a power receptacle panel of an uninterruptable power supply (UPS) system, the method comprising:
providing a UPS system with a housing comprising internal power circuitry, a replaceable power receptacle panel held in an externally accessible compartment of the UPS system, and a mechanical interlock affixed to the housing and configured to block or unblock a portion of the power receptacle panel;
moving a circuit interrupter in the housing adjacent the compartment to an OFF position to de-energize the replaceable power receptacle panel;
moving the mechanical interlock to unblock the portion of the replaceable power receptacle panel; then
removing the replaceable power receptacle panel from the compartment of the UPS system; then
installing another replaceable power receptacle panel in the compartment of the UPS system;

moving the circuit interrupter to an ON position to energize power receptacles of the other replaceable power receptacle panel; and moving the mechanical interlock to block a portion of the other replaceable power receptacle panel to prevent removal thereof when the circuit interrupter is in the ON position.

15. The method of claim 14, wherein (i) the step of moving the circuit interrupter to the OFF position and the step of moving the mechanical interlock to unblock the portion of the replaceable power receptacle panel are concurrently carried out whereby movement of a handle of the circuit interrupter to the OFF position automatically moves the mechanical interlock to unblock a front surface of the replaceable power receptacle panel as the portion of the replaceable power receptacle panel and (ii) the step of moving the circuit interrupter to the ON position and the step of moving the mechanical interlock to block the front surface of the replaceable power receptacle panel are concurrently carried out whereby movement of the handle of the circuit interrupter to the ON position automatically moves the mechanical interlock to block the front surface of the replaceable power receptacle panel.

16. A method of replacing a power receptacle panel of an uninterruptable power supply (UPS) system, the method comprising:

providing a UPS system with a housing comprising internal power circuitry, a replaceable power receptacle panel held in an externally accessible compartment of the UPS system, and a mechanical interlock configured to block or unblock a portion of the power receptacle panel;

moving a circuit interrupter in the housing adjacent the compartment to an OFF position to de-energize the replaceable power receptacle panel;

moving the mechanical interlock to unblock the portion of the replaceable power receptacle panel; then removing the replaceable power receptacle panel from the compartment of the UPS system; then installing another replaceable power receptacle panel in the compartment of the UPS system;

moving the circuit interrupter to an ON position to energize power receptacles of the other replaceable power receptacle panel; and moving the mechanical interlock to block a portion of the other replaceable power receptacle panel to prevent removal thereof when the circuit interrupter is in the ON position, wherein the replaceable power receptacle panel has a back side with a connector, the method further comprising mating the connector with an aligned receiving connector in the compartment to couple the power receptacle panel to a power output path defined between the aligned receiving connector and the internal power circuitry when the circuit interrupter is in the OFF position.

17. The method of claim 14, wherein the step of moving the mechanical interlock to block a portion of the other replaceable power receptacle panel comprises sliding or rotating the mechanical interlock in response to sliding or rotating a switch handle of the circuit interrupter to place the mechanical interlock over an externally visible portion of the other replaceable power receptacle panel when the circuit interrupter is in the ON position to prevent removal of the other replaceable power receptacle panel from the compartment.

18. The method of claim 14, wherein the mechanical interlock is defined by or affixed to an externally visible arm of a switch handle of the circuit interrupter and moves between blocked and unblocked positions in response to movement of the switch handle of the circuit interrupter between ON and OFF positions to automatically block and unblock the power receptacle panel.

19. A power supply system comprising:

a housing defining at least one compartment that contains a connector;

power circuitry provided in the housing, wherein the power circuitry is coupled to the connector defining a power output path therebetween;

a replaceable receptacle panel comprising a panel connector that is detachably coupled to the connector in the compartment;

a circuit interrupter provided at least partially in the housing adjacent to the replaceable receptacle panel and electrically coupled along the power output path between the connector in the compartment and the power circuitry, wherein the circuit interrupter comprises a switch handle that is externally accessible and configured to allow a user to move the switch handle between an ON position, where power provided along the power output path is uninterrupted, and an OFF position, where power along the load output path is interrupted to electrically isolate the replaceable receptacle panel from the power circuitry; and a mechanical interlock coupled to the switch handle, wherein, when the switch handle of the circuit interrupter is in the OFF position, the replaceable receptacle panel is removable from the compartment of the housing, and wherein, when the switch handle of the circuit interrupter is in the ON position, the mechanical interlock blocks at least a portion of the replaceable receptacle panel to prevent removal of the replaceable receptacle panel from the compartment of the housing.

20. The power supply system of claim 19, wherein the replaceable receptacle panel is capable of being removed from the housing when the switch handle of the circuit interrupter is in the OFF position, and when the power supply system is in an ON state and/or when at least a portion of the power output path is energized.

21. A power supply system comprising:

a housing, power circuitry provided in the housing;

a replaceable receptacle panel removably coupled to the housing;

a circuit interrupter provided at least partially in the housing, wherein the circuit interrupter is electrically coupled between the power circuitry and the replaceable receptacle panel, wherein the circuit interrupter includes a switch handle that is externally accessible and configured to allow a user to move the switch handle between an ON position, where power is permitted to flow from the power circuitry to the replaceable receptacle panel, and an OFF position, where power is prevented from flowing from the power circuitry to the replaceable receptacle panel; and an interlock coupled to the switch handle and affixed to the housing, wherein, when the switch handle of the circuit interrupter is in the OFF position, the replaceable receptacle panel is removable from the housing, and wherein, when the switch handle of the circuit interrupter is in the ON position, the interlock prevents removal of the replaceable receptacle panel from the housing.

22. The power supply system of claim 21, wherein the housing defining at least one compartment that contains a connector and the replaceable receptacle panel includes a panel connector that is detachably coupled to the connector in the compartment.

23. The power supply system of claim 22, wherein the power circuitry is electrically coupled to the connector in the compartment defining a power output path therebetween.

24. The power supply system of claim 23, wherein the replaceable receptacle panel is capable of being removed from the housing when the switch handle of the circuit interrupter is in the OFF position and when the power supply system is in an ON state, wherein the power receptacle panel comprises a power receptacle panel housing that houses at least one circuit breaker, wherein the at least one circuit breaker of the power receptacle panel is positionable in ON and OFF positions, and wherein the power receptacle panel housing is detachable from the power supply system housing while the power supply system is in the ON state and with the at least one circuit breaker housed in the power receptacle panel housing in either the ON or OFF position.

25. The power supply system of claim 22, wherein the replaceable receptacle panel is capable of being removed from the housing when the switch handle of the circuit interrupter is in the OFF position and when at least a portion of the power output path is energized.

26. The power supply system of claim 7, wherein the compartment comprises a recess that extends inwardly and further comprises a power connector, wherein the power connector is aligned with and configured to be electrically coupled to a connector extending from a rear wall of a power receptacle housing providing the power receptacle panel, thereby electrically coupling the power receptacle panel to the power circuitry when the circuit interrupter is in the ON position, and wherein the circuit interrupter is electrically coupled along a power output path between the power connector in the compartment and the power circuitry.

27. The power supply system of claim 19, wherein the mechanical interlock has an elongate configuration to extend over a portion of a front surface of the replaceable power receptacle panel when the switch handle of the circuit interrupter is in the ON position and is spaced apart from the replaceable power receptacle panel when the switch handle of the circuit interrupter is in the OFF position.

\* \* \* \* \*

UNITED STATES PATENT AND TRADEMARK OFFICE
CERTIFICATE OF CORRECTION

| | | |
|---|---|---|
| PATENT NO. | : 11,444,415 B2 | |
| APPLICATION NO. | : 16/588048 | |
| DATED | : September 13, 2022 | |
| INVENTOR(S) | : Scott Jason Davis | |

It is certified that error appears in the above-identified patent and that said Letters Patent is hereby corrected as shown below:

On the Title Page

(56) References Cited, page 2, Foreign Patent Documents:
Please correct "CN 207826266 9/2018"
To read -- CN 207926266 9/2018 --

Signed and Sealed this
Fourth Day of April, 2023

Katherine Kelly Vidal
*Director of the United States Patent and Trademark Office*